United States Patent
Lin et al.

(10) Patent No.: US 12,191,555 B2
(45) Date of Patent: Jan. 7, 2025

(54) POWER DIVIDER AND SINGLE POLE DOUBLE THROW SWITCH DEVICE USING THE SAME

(71) Applicant: National Chi Nan University, Nantou (TW)

(72) Inventors: Yo-Sheng Lin, Puli (TW); Bo-Shun Chen, Puli (TW); Yu-Cian Peng, Puli (TW)

(73) Assignee: NATIONAL CHI NAN UNIVERSITY, Nantou (TW)

( * ) Notice: Subject to any disclaimer, the term of this patent is extended or adjusted under 35 U.S.C. 154(b) by 237 days.

(21) Appl. No.: 17/946,627

(22) Filed: Sep. 16, 2022

(65) Prior Publication Data

US 2023/0378628 A1 Nov. 23, 2023

(30) Foreign Application Priority Data

May 18, 2022 (TW) .................................. 111118559

(51) Int. Cl.
*H03H 7/42* (2006.01)
*H01P 5/18* (2006.01)

(52) U.S. Cl.
CPC ................ *H01P 5/18* (2013.01); *H01P 5/184* (2013.01); *H03H 7/42* (2013.01)

(58) Field of Classification Search
CPC .. H01P 5/20; H01P 5/184; H01P 5/185; H01P 5/16; H01P 5/10; H01P 3/08; H03H 7/42; H03H 7/422
See application file for complete search history.

(56) References Cited

U.S. PATENT DOCUMENTS

2023/0030569 A1* 2/2023 Kim ........................ H01P 5/16
2023/0231532 A1* 7/2023 Gittemeier ............... H01P 5/12
                                                           455/73

FOREIGN PATENT DOCUMENTS

CN           111916882 A   * 11/2020   ............. H01P 5/16

* cited by examiner

*Primary Examiner* — Stephen E. Jones
(74) *Attorney, Agent, or Firm* — Birch, Stewart, Kolasch & Birch, LLP

(57) ABSTRACT

A power divider includes first to third transmission lines (TLs) and first to third capacitors. The second TL includes a first transmission portion (TP) and a first output portion (OP). The first TP is connected between the first TL and the first OP. The third TL includes a second TP and a second OP. The second TP is connected between the first TL and the second OP. The first capacitor is connected between ground and a common node of the first TL and the first and second TPs. The second capacitor is connected between ground and a terminal of the first OP distal from the first TP. The third capacitor is connected between ground and a terminal of the second OP distal from the second TP.

6 Claims, 13 Drawing Sheets

POWER DIVIDER AND SINGLE POLE DOUBLE THROW SWITCH DEVICE USING THE SAME

CROSS-REFERENCE TO RELATED APPLICATION

This application claims priority of Taiwanese Patent Application No. 111118559, filed on May 18, 2022.

FIELD

The disclosure relates to a divider and a switch device, and more particularly to a power divider and a single pole double throw switch device using the power divider.

BACKGROUND

Referring to FIG. 1, a conventional Wilkinson power divider is configured to operate within a frequency range that covers a target frequency, and can be used to divide an input signal (Pi) into two output signals (Po). The conventional Wilkinson power divider includes an input portion 10, two transmission portions 11, 12 and two output portions 13, 14. Each of the input portion 10, the transmission portions 11, 12 and the output portions 13, 14 is implemented as a transmission line.

Each of the transmission portions 11, 12 has a length of $\lambda/4$, where $\lambda$ is a target wavelength corresponding to the target frequency. Therefore, the conventional Wilkinson power divider has the disadvantage of occupying a relatively large area and having a relatively high manufacturing cost. A device using the conventional Wilkinson power divider will also have the aforesaid problems.

SUMMARY

Therefore, an object of the disclosure is to provide a power divider and a single pole double throw (SPDT) switch device using the power divider. The power divider aims to alleviate at least one of the drawbacks of the prior art.

According to an aspect of the disclosure, the power divider includes a first transmission line, a second transmission line, a third transmission line, an input capacitor and two output capacitors. The first transmission line has a first terminal and a second terminal. The second transmission line includes a first transmission portion and a first output portion. Each of the first transmission portion and the first output portion has a first terminal and a second terminal. The first terminal of the first transmission portion is connected to the second terminal of the first transmission line. The second terminal of the first transmission portion is connected to the first terminal of the first output portion. The third transmission line includes a second transmission portion and a second output portion. Each of the second transmission portion and the second output portion has a first terminal and a second terminal. The first terminal of the second transmission portion is connected to the second terminal of the first transmission line. The second terminal of the second transmission portion is connected to the first terminal of the second output portion. The input capacitor is connected between the second terminal of the first transmission line and ground. One of the output capacitors is connected between the second terminal of the first output portion and ground. The other one of the output capacitors is connected between the second terminal of the second output portion and ground.

According to another aspect of the disclosure, the SPDT switch device includes the power divider described above, an inverter, a first transistor, a first resistor, a second resistor, a second transistor, a third resistor and a fourth resistor. The inverter has an input terminal that receives a control signal, and an output terminal that provides an inverted signal. The inverted signal is a logical complement of the control signal in logical value. The first transistor has a first terminal that is connected to the second terminal of the first output portion of the second transmission line, a second terminal that is connected to ground, a control terminal and a body terminal. The first resistor is connected between the body terminal of the first transistor and the input terminal of the inverter. The second resistor is connected between the control terminal of the first transistor and the input terminal of the inverter. The second transistor has a first terminal that is connected to the second terminal of the second output portion of the third transmission line, a second terminal that is connected to ground, a control terminal and a body terminal. The third resistor is connected between the control terminal of the second transistor and the output terminal of the inverter. The fourth resistor is connected between the body terminal of the second transistor and the output terminal of the inverter.

BRIEF DESCRIPTION OF THE DRAWINGS

Other features and advantages of the disclosure will become apparent in the following detailed description of the embodiments with reference to the accompanying drawings. It is noted that various features may not be drawn to scale.

DETAILED DESCRIPTION

Figure 1:
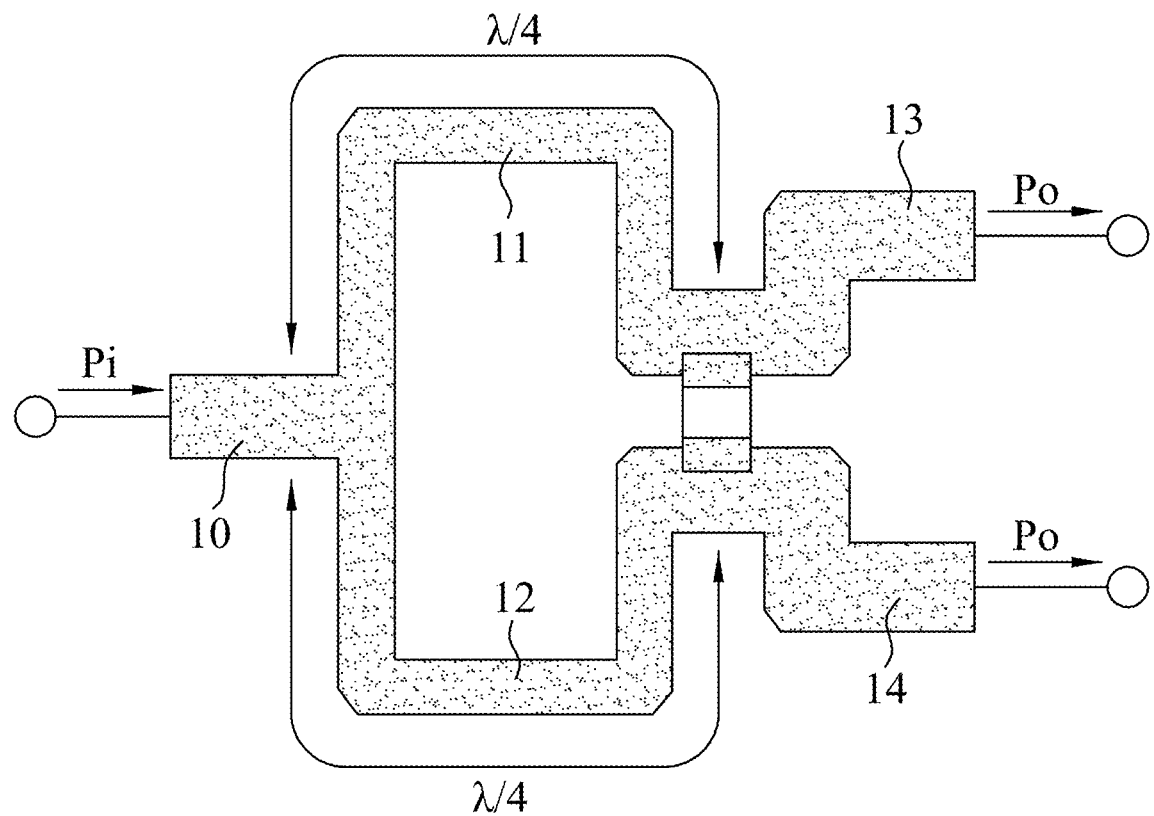
FIG. 1 is a structural diagram illustrating a conventional Wilkinson power divider.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
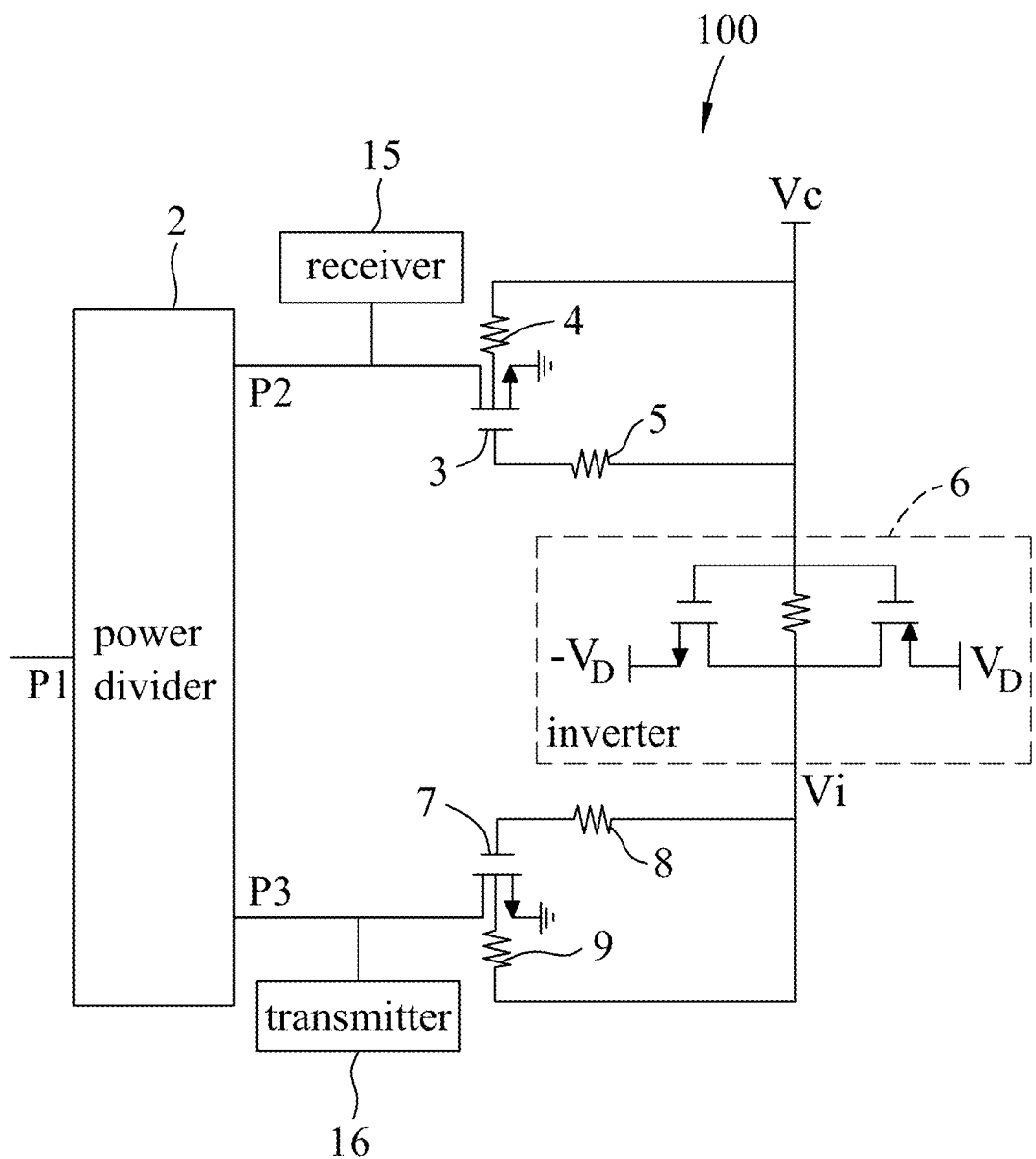
FIG. 2 is a circuit block diagram illustrating a first embodiment of a single pole double throw (SPDT) switch device according to the disclosure.
Figure 3:
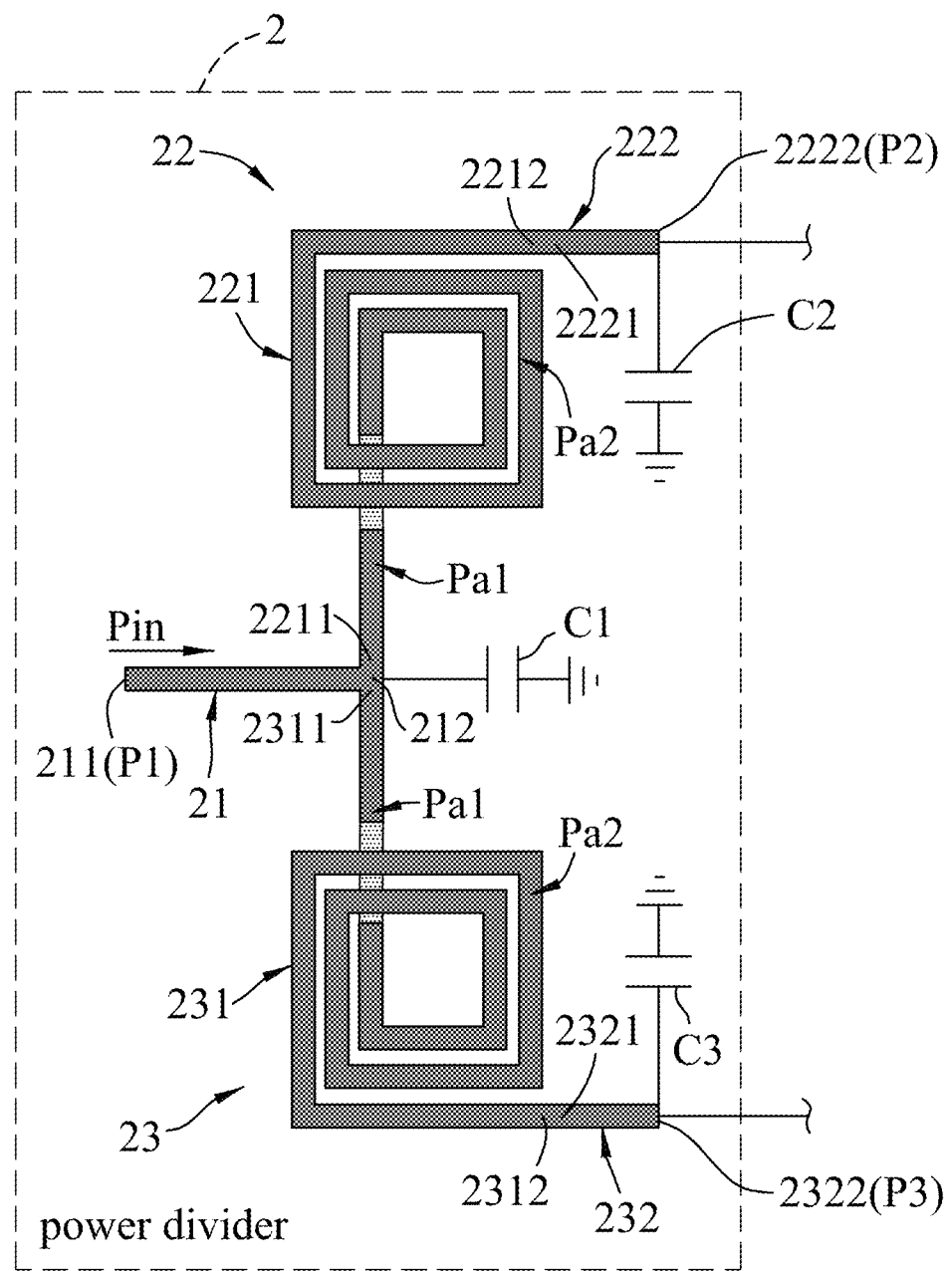
FIG. 3 is a schematic diagram illustrating a power divider of the first embodiment.
Figure 4:
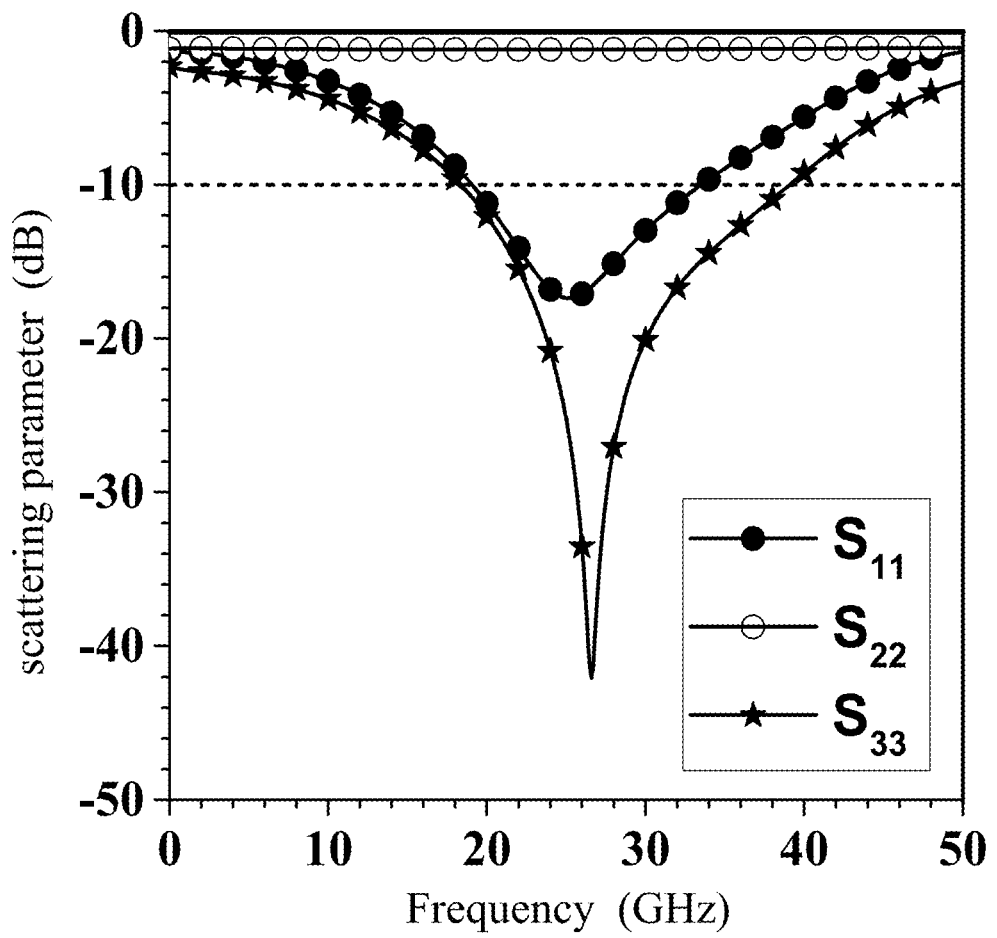
FIGS. 4 to 6 are plots illustrating simulated scattering parameters of the power divider when a radio frequency (RF) transceiver system using the first embodiment operates in a transmit mode.
Figure 5:
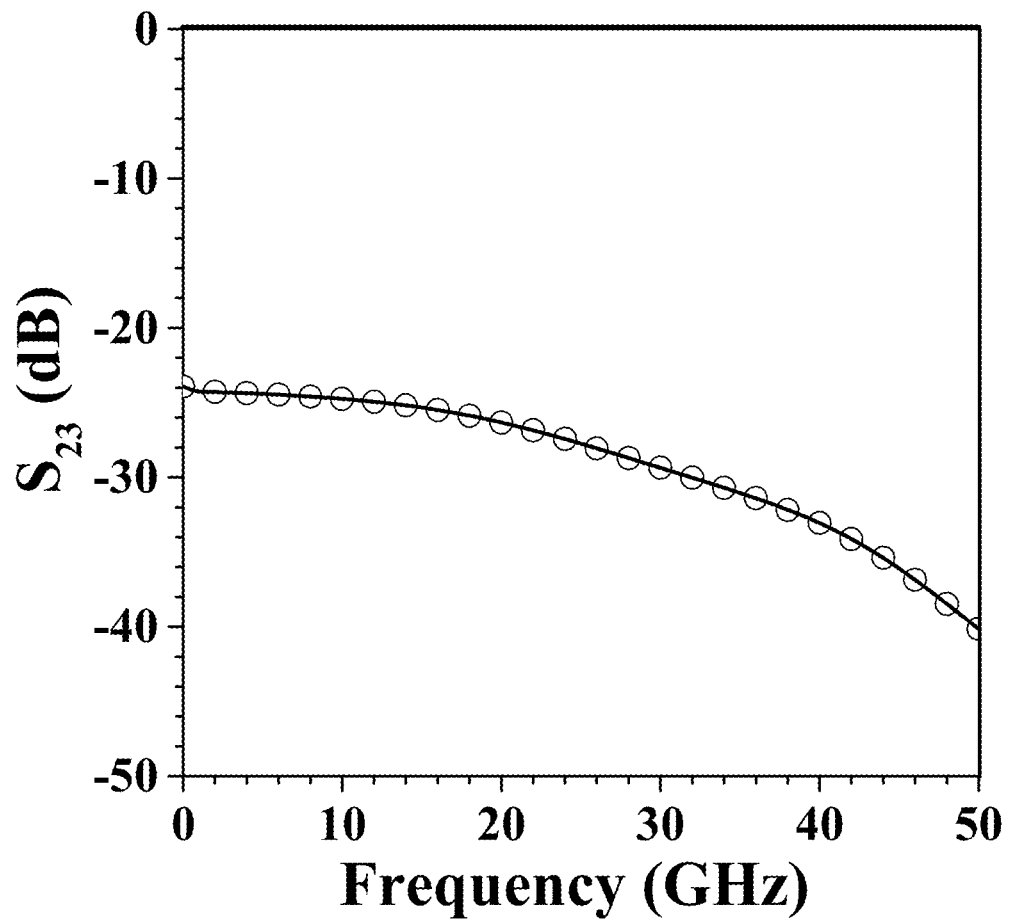
Figure 6:
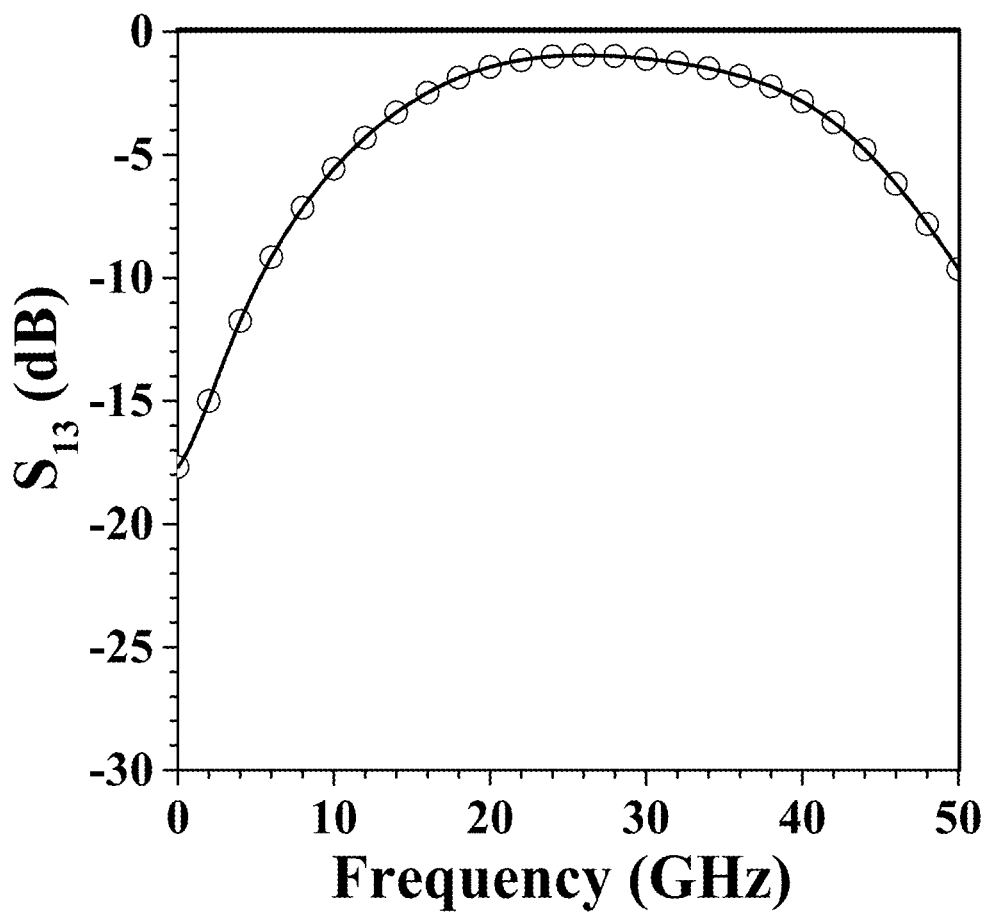
Figure 7:
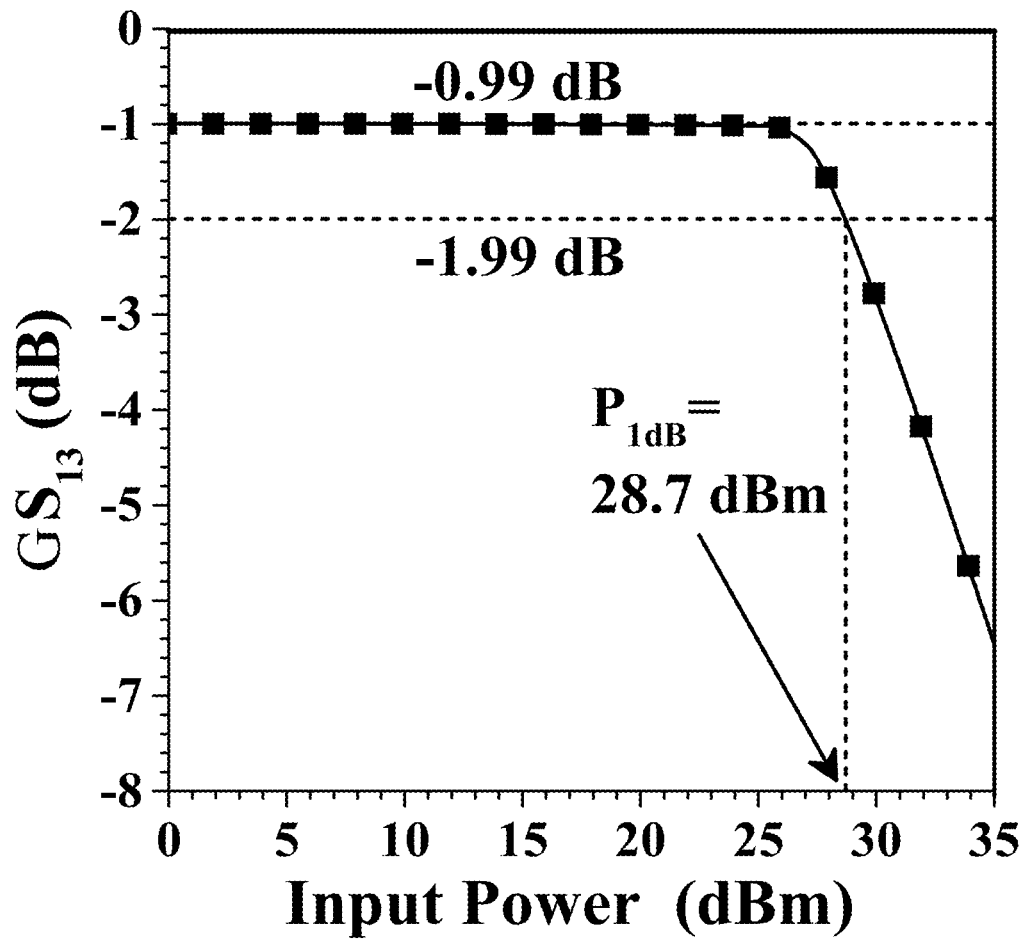
FIG. 7 is a plot illustrating a simulated power gain of the power divider when the RF transceiver system operates in the transmit mode.

Referring to FIGS. 2 and 3, a first embodiment of a single pole double throw (SPDT) switch device 100 according to the disclosure is adapted to be used in a radio frequency (RF) transceiver system. The RF transceiver system includes at least a receiver 15 and a transmitter 16. The SPDT switch device 100 of this embodiment includes a power divider 2, an inverter 6, a first transistor 3, a first resistor 4, a second resistor 5, a second transistor 7, a third resistor 8 and a fourth resistor 9.

The power divider 2 is configured to operate within a frequency range that covers a target frequency, and includes a first transmission line 21, a second transmission line 22, a third transmission line 23, an input capacitor (C1) and two output capacitors (C2, C3).

The first transmission line 21 has a first terminal 211 that serves as a first port (P1) of the power divider 2, and a second terminal 212.

The second transmission line 22 includes a first transmission portion 221 and a first output portion 222. Each of the first transmission portion 221 and the first output portion 222 has a first terminal 2211/2221 and a second terminal 2212/2222. The first terminal 2211 of the first transmission portion 221 is connected to the second terminal 212 of the first transmission line 21. The second terminal 2212 of the first transmission portion 221 is connected to the first terminal 2221 of the first output portion 222. The second terminal 2222 of the first output portion 222 serves as a second port (P2) of the power divider 2, and is adapted to be connected to the receiver 15.

The third transmission line 23 includes a second transmission portion 231 and a second output portion 232. Each of the second transmission portion 231 and the second output portion 232 has a first terminal 2311/2321 and a second terminal 2312/2322. The first terminal 2311 of the second transmission portion 231 is connected to the second terminal 212 of the first transmission line 21. The second terminal 2312 of the second transmission portion 231 is connected to the first terminal 2321 of the second output portion 232. The second terminal 2322 of the second output portion 232 serves as a third port (P3) of the power divider 2, and is adapted to be connected to the transmitter 16.

When the power divider 2 is used alone and the first terminal 211 of the first transmission line 21 receives an input signal (Pin), the second terminals 2222, 2322 of the first and second output portions 222, 232 cooperatively output a pair of output signals that are in-phase, and each of the output signals has a frequency equal to that of the input signal (Pin), and has a power magnitude equal to one half of that of the input signal (Pin).

In this embodiment, the first and second transmission portions 221, 231 are not interwound, and each of the first and second transmission portions 221, 231 has a length that is one-twelfth of a target wavelength, which corresponds to the target frequency. That is to say, the length of each of the first and second transmission portions 221, 231 is $\lambda/12$, where $\lambda$ is the target wavelength.

The input capacitor (C1) is connected between the second terminal 212 of the first transmission line 21 and ground. The output capacitor (C2) is connected between the second terminal 2222 of the first output portion 222 and ground. The output capacitor (C3) is connected between the second terminal 2322 of the second output portion 232 and ground. In this embodiment, each of the output capacitors (C2, C3) has a capacitance equal to one half of that of the input capacitance (C1).

The inverter 6 has an input terminal that receives a control signal (Vc), and an output terminal that provides an inverted signal (Vi). The inverted signal (Vi) is a logical complement of the control signal (Vc) in logical value. In this embodiment, the inverter 6 is powered by a first supply voltage having a magnitude of $V_D$ and a second supply voltage having a magnitude of $-V_D$.

The first transistor 3 has a first terminal that is connected to the second terminal 2222 of the first output portion 222 of the second transmission line 22, a second terminal that is connected to ground, a control terminal and a body terminal. In this embodiment, the first transistor 3 is an N-type metal oxide semiconductor field effect transistor (nMOSFET) having a drain terminal, a source terminal, a gate terminal and a body terminal that respectively serve as the first terminal, the second terminal, the control terminal and the body terminal of the first transistor 3.

The first resistor 4 is connected between the body terminal of the first transistor 3 and the input terminal of the inverter 6. The second resistor 5 is connected between the control terminal of the first transistor 3 and the input terminal of the inverter 6.

The second transistor 7 has a first terminal that is connected to the second terminal 2322 of the second output portion 232 of the third transmission line 23, a second terminal that is connected to ground, a control terminal and a body terminal. In this embodiment, the second transistor 7 is an nMOSFET having a drain terminal, a source terminal, a gate terminal and a body terminal that respectively serve as the first terminal, the second terminal, the control terminal and the body terminal of the second transistor 7.

The third resistor 8 is connected between the control terminal of the second transistor 7 and the output terminal of the inverter 6. The fourth resistor 9 is connected between the body terminal of the second transistor 7 and the output terminal of the inverter 6.

In this embodiment, a characteristic impedance ($Z_T$) of each of the first and second transmission portions 221, 231 can be expressed by the following equation:

$$Z_T = \frac{R_0}{\sin\theta},$$

wherein $R_0$ denotes a characteristic impedance of the power divider 2 and is 50Ω in this embodiment, and wherein θ denotes an electrical length of the transmission portion 221/231. In order to alleviate adverse effects resulting from power loss of a transmission line, each of the first and second transmission portions 221, 231 is designed to have a characteristic impedance ($Z_T$) of 100Ω in this embodiment. Based on the aforementioned equation, the electrical length (θ) is 30° (i.e., a physical length of the transmission portion 221/231 is about $\lambda/12$) when the characteristic impedance ($Z_T$) is 100Ω and the characteristic impedance ($R_0$) is 50Ω.

In addition, the capacitance ($C_P$) of each of the output capacitors (C2, C3) can be expressed by the following equation:

$$C_P = \frac{\cos\theta}{\omega_0 \cdot R_0},$$

wherein $\omega_0$ denotes a target angular frequency corresponding to the target frequency of $f_0$, i.e., $\omega_0 = 2\pi \cdot f_0$. The capacitance ($C_P$) of each of the output capacitors (C2, C3) is 98.45 fF and the capacitance of the input capacitor (C1) is 196.9 fF when the electrical length (θ) is 30°, the target frequency ($f_0$) is 28 GHz, and the characteristic impedance ($R_0$) is 50Ω. Although the input capacitor (C1) and the output capacitors (C2, C3) are added to the power divider 2 as required, the power divider 2 still only occupies a small area since an area that each of the input capacitor (C1) and the output capacitors (C2, C3) occupies is very small.

In this embodiment, the power divider 2 is fabricated using a 0.18 μm complementary metal oxide semiconductor (CMOS) process. The second and third transmission lines 22, 23 are line-symmetrical with each other. Each of the first and second transmission portions 221, 231 has a first part (Pa1) and a second part (Pa2) that are connected to each other. The first part (Pa1) of each of the first and second transmission portions 221, 231 is further connected to the second terminal 212 of the first transmission line 21, and is configured as a straight strip. The second part (Pa2) of the first transmission portion 221 is further connected to the first terminal 2221 of the first output portion 222, and is configured as a rectangular spiral in a clockwise direction. The second part (Pa2) of the second transmission portion 231 is further connected to the first terminal 2321 of the second output portion 232, and is configured as a rectangular spiral in a counterclockwise direction.

The RF transceiver system is operable in one of two modes that include a transmit mode and a receive mode. When the control signal (Vc) has a logical value of "1" that corresponds to a voltage magnitude of $V_D$, the RF transceiver system operates in the transmit mode. At this time, the first transistor 3 conducts, so an impedance seen into the second transmission line 22 from the first terminal 2211 of the first transmission portion 221 is very large (ideally infinite), and no signal path is established between the first and second ports (P1, P2). Meanwhile, the second transistor 7 does not conduct, so an impedance seen into the third transmission line 23 from the first terminal 2311 of the second transmission portion 231 is equal to an output impedance of the transmitter 16 (i.e., 50Ω in this embodiment), and a signal path is established between the first and third ports (P1, P3). Therefore, the power divider 2 may receive a signal outputted by the transmitter 16 at the third port (P3), and may output the signal at the first port (P1). When the control signal (Vc) has a logical value of "0" that corresponds to a voltage magnitude of $-V_D$, the RF transceiver system operates in the receive mode. At this time, the first transistor 3 does not conduct, so the impedance seen into the second transmission line 22 from the first terminal 2211 of the first transmission portion 221 is equal to an input impedance of the receiver 15 (i.e., 50Ω in this embodiment), and a signal path is established between the first and second ports (P1, P2). Meanwhile, the second transistor 7 conducts, so the impedance seen into the third transmission line 23 from the first terminal 2311 of the second transmission portion 231 is very large (ideally infinite), and no signal path is established between the first and third ports (P1, P3). Therefore, the power divider 2 may receive a signal at the first port (P1), and may output the signal at the second port (P2) to be received by the receiver 15.

Figure 8:
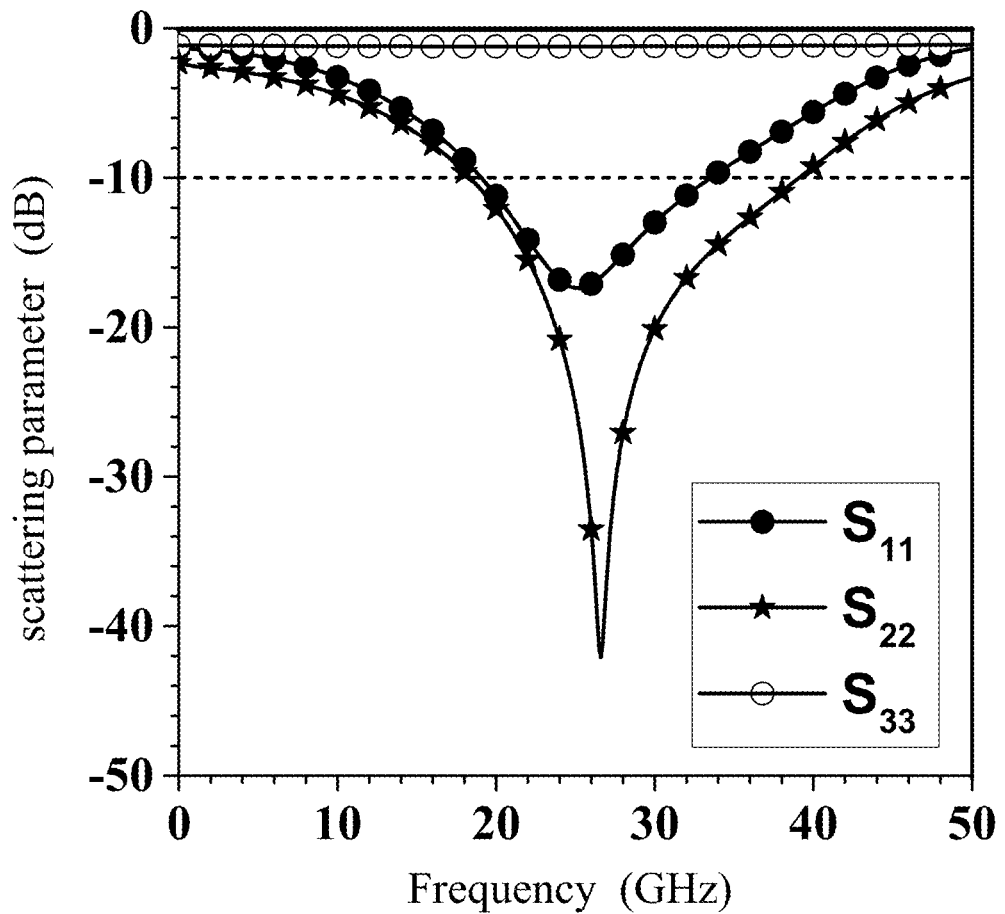
FIGS. 8 to 10 are plots illustrating simulated scattering parameters of the power divider when the RF transceiver system operates in a receive mode.
Figure 9:
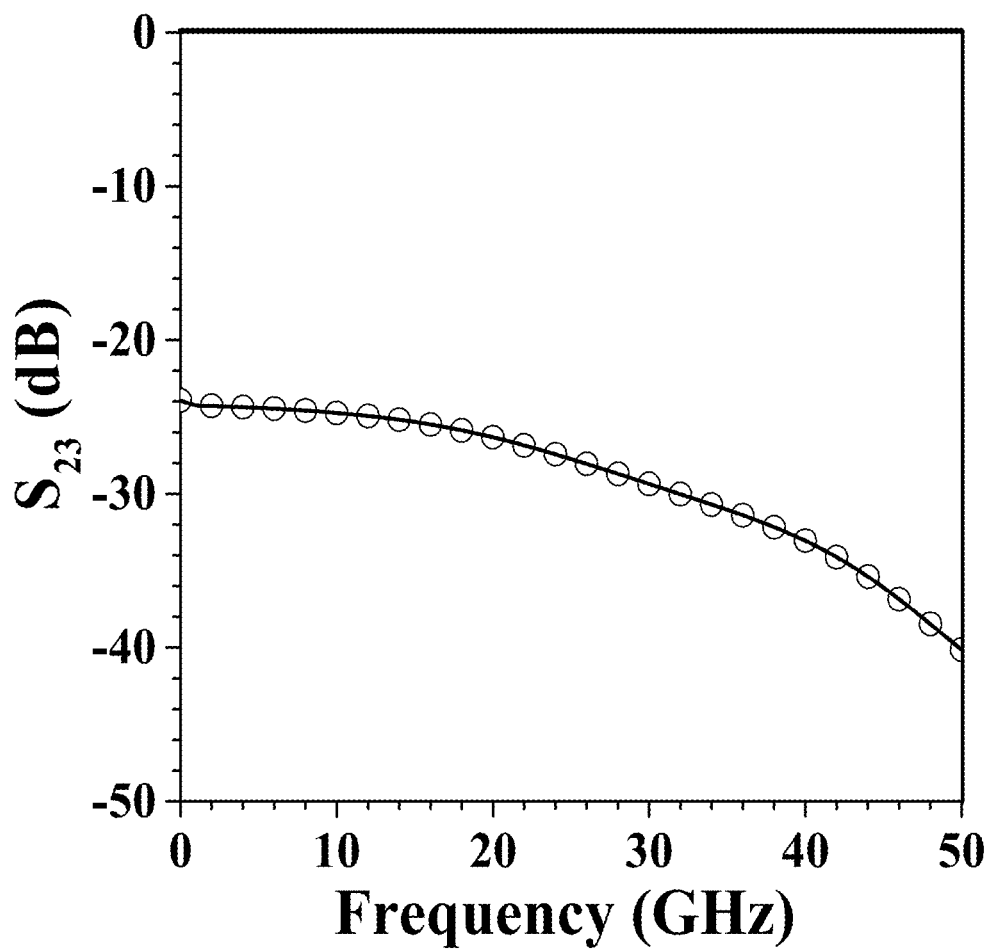
Figure 10:
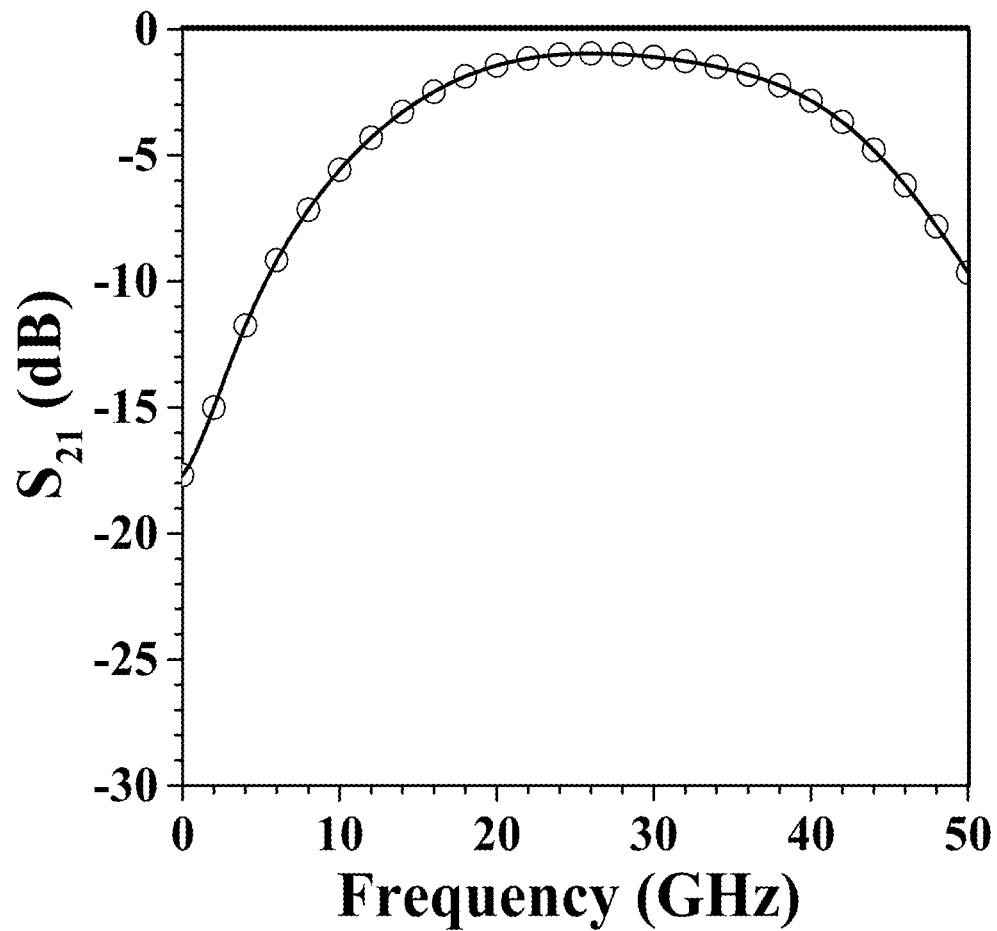

Referring to FIGS. 2 and 4 to 7, FIGS. 4 to 6 illustrate simulated scattering parameters ($S_{11}$, $S_{22}$, $S_{33}$, $S_{23}$, $S_{13}$) of the power divider 2 in a scenario wherein $V_D$=2.5V, the RF transceiver system operates in the transmit mode, and a frequency of the signal outputted by the transmitter 15 falls within a range of from 0 GHz to 50 GHz; and FIG. 8 illustrates simulated power gain ($GS_{13}$) from the third port (P3) to the first port (P1) of the power divider 2 in a scenario wherein $V_D$=2.5V, the RF transceiver system operates in the transmit mode, the frequency of the signal outputted by the transmitter is 28 GHz, and input power of the power divider 2 (i.e., power of the signal outputted by the transmitter 15) falls within a range of from 0 dBm to 35 dBm. In this embodiment, the power divider 2 is implemented as a Ka-band power divider (i.e., the frequency range in which the power divider 2 operates ranges from 26.5 GHz to 40 GHz). Ideally, when the RF transceiver system operates in the transmit mode, each of the scattering parameter ($S_{11}$), which is a reflection coefficient at the first port (P1), and the scattering parameter ($S_{33}$), which is a reflection coefficient at the third port (P3), is minus infinity dB (i.e., no reflection occurs at each of the first and third ports (P1, P3)); the scattering parameter ($S_{22}$), which is a reflection coefficient at the second port (P2), is 0 dB (i.e., total reflection occurs at the second port (P2)); the scattering parameter ($S_{23}$), which is related to an isolation from the third port (P3) to the second port (P2), is minus infinity dB (i.e., signal leak from the third port (P3) to the second port (P2) does not occur); the scattering parameter ($S_{13}$), which is related to an insertion loss from the third port (P3) to the first port (P1), is 0 dB (i.e., no loss is produced); and an input 1 dB compression point ($P_{1\ dB}$) is infinity dBm (i.e., the power divider 2 exhibits excellent linearity, and does not distort the signal outputted by the transmitter 16 even if the power of the signal is very large). It should be noted that the input 1 dB compression point ($P_{1\ dB}$) is a value of the input power that makes the power gain ($GS_{13}$) have a value smaller by 1 dB than another value of the power gain ($GS_{13}$), which results from another small value of the input power. For example, if the value of the input power is small and is 10 dBm and makes the power gain ($GS_{13}$) have a value of −1 dB, the input 1 dB compression point ($P_{1\ dB}$) is the value of the input power that makes the power gain ($GS_{13}$) have a value of −2 dB. It may reasonably be determined from FIGS. 4 to 7 that the characteristics of the SPDT switch device 100 of this embodiment are close to ideal in the Ka band when the RF transceiver system operates in the transmit mode.

Figure 11:
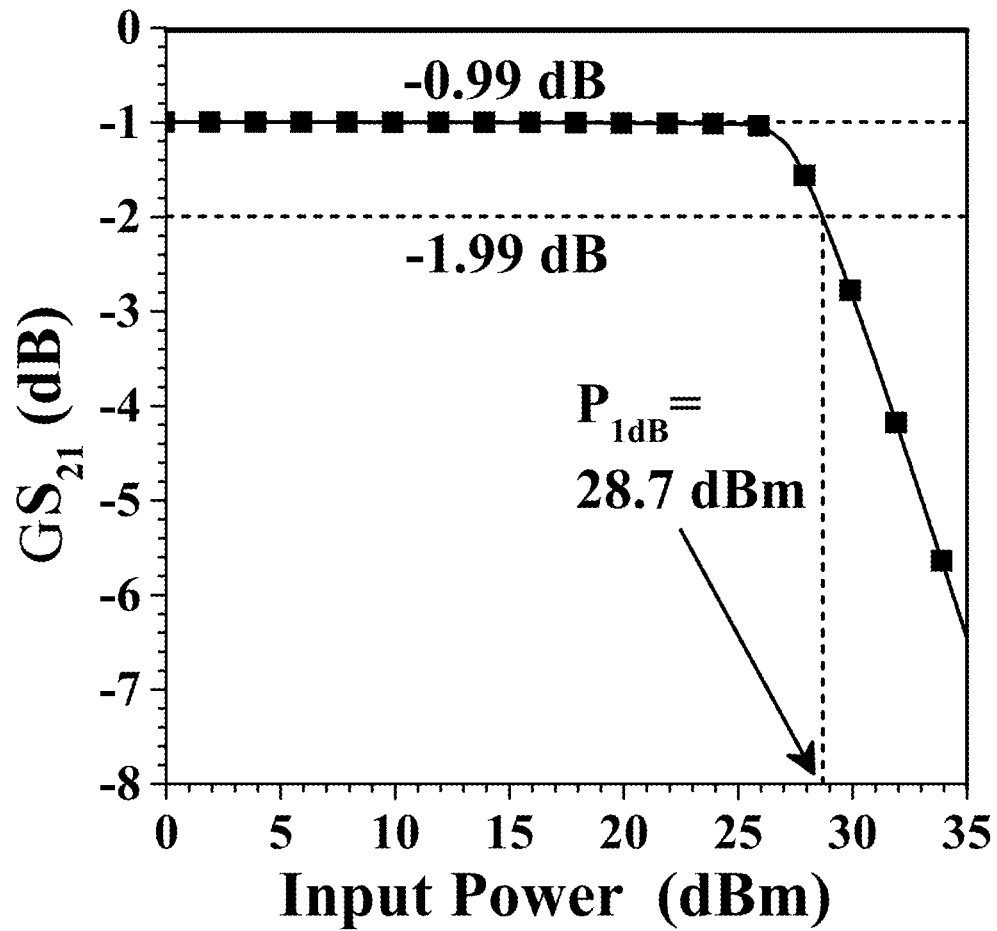
FIG. 11 is a plot illustrating a simulated power gain of the power divider when the RF transceiver system operates in the receive mode.

Referring to FIGS. 2 and 8 to 11, FIGS. 8 to 10 illustrate simulated scattering parameters ($S_{11}$, $S_{22}$, $S_{22}$, $S_{23}$, $S_{21}$) of the power divider 2 in a scenario wherein $V_D$=2.5V, the RF transceiver system operates in the receive mode, and a frequency of the signal received by the power divider 2 at the second port (P2) falls within a range of from 0 GHz to 50 GHz; and FIG. 11 illustrates simulated power gain ($GS_{21}$) from the first port (P1) to the second port (P2) of the power divider 2 in a scenario wherein $V_D$=2.5V, the RF transceiver system operates in the receive mode, a frequency of the signal received by the power divider 2 at the second port (P2) is 28 GHz, and input power of the power divider 2 (i.e., power of the signal received by the power divider 2 at the second port (P2)) falls within a range of from 0 dBm to 35 dBm. Ideally, when the RF transceiver system operates in the receive mode, each of the scattering parameter ($S_{11}$), which is a reflection coefficient at the first port (P1), and the scattering parameter ($S_{22}$), which is a reflection coefficient at the second port (P2), is minus infinity dB (i.e., no reflection occurs at each of the first and second ports (P1, P2)); the scattering parameter ($S_{33}$), which is a reflection coefficient at the third port (P3), is 0 dB (i.e., total reflection occurs at the third port (P3)); the scattering parameter ($S_{23}$), which is related to an isolation from the third port (P3) to the second port (P2), is minus infinity dB (i.e., signal leak from the third port (P3) to the second port (P2) does not occur); the scattering parameter ($S_{21}$), which is related to an insertion loss from the first port (P1) to the second port (P2), is 0 dB (i.e., no loss is produced); and an input 1 dB compression point ($P_{1\ dB}$) is infinity dBm (i.e., the power divider 2 exhibits excellent linearity, and does not distort the signal received thereby at the second port (P2) even if the power of the signal is very large). It should be noted that the input 1 dB compression point ($P_{1\ dB}$) is a value of the input power that makes the power gain ($GS_{21}$) have a value smaller by 1 dB than another value of the power gain ($GS_{21}$), which results from another small value of the input power. For example, if the value of the input power is small and is 10 dBm and makes the power gain ($GS_{21}$) have a value of −1 dB, the input 1 dB compression point ($P_{1\ dB}$) is the value of the input power that makes the power gain ($GS_{21}$) have a value of −2 dB. It may be reasonably determined from FIGS. 8 to 11 that the characteristics of the SPDT switch device 100 of this embodiment are close to ideal in the Ka band when the RF transceiver system operates in the receive mode.

Figure 12:
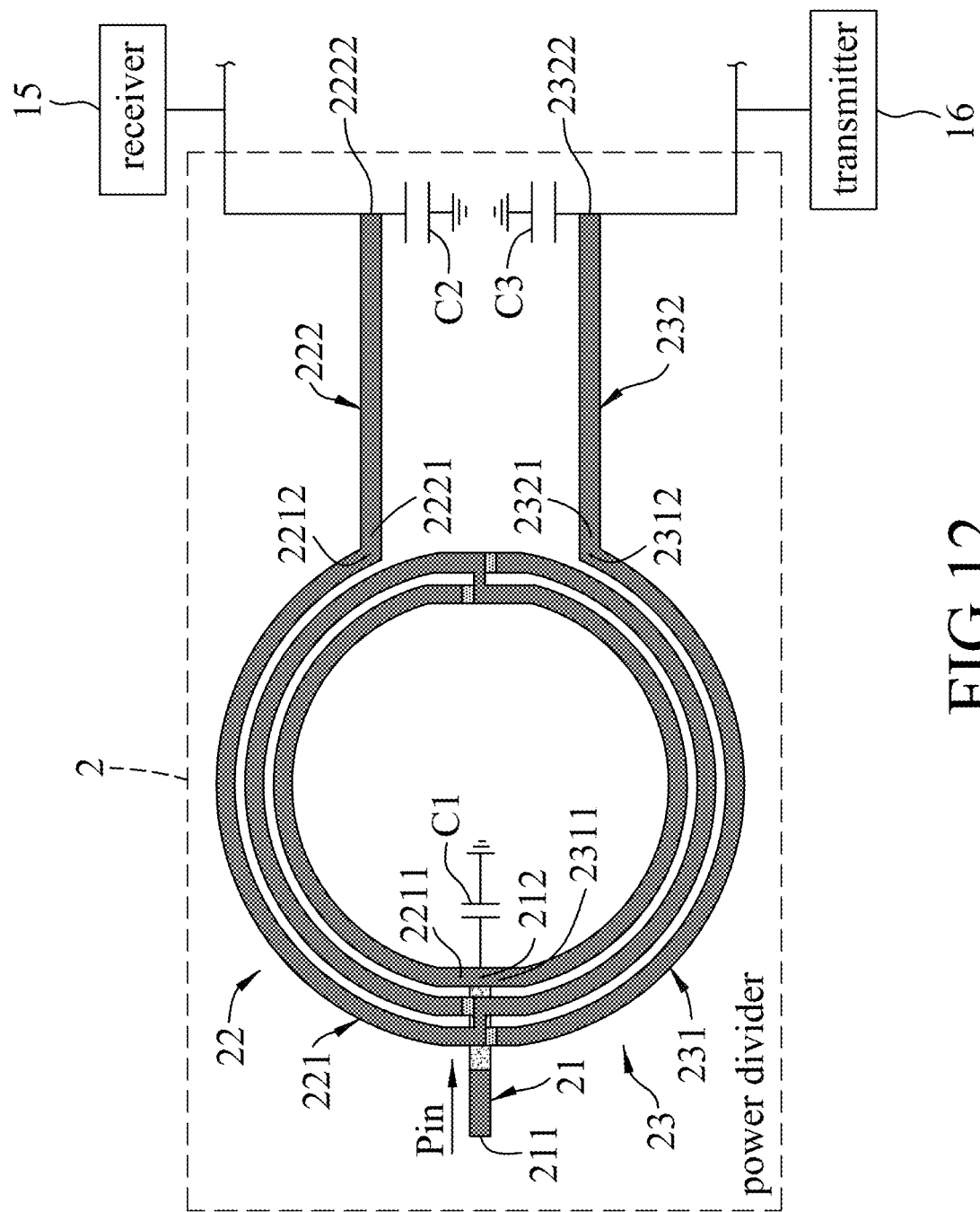
FIG. 12 is a schematic diagram illustrating the power divider of a second embodiment of the SPDT switch device according to the disclosure.

Referring to FIGS. 2 and 12, a second embodiment of the SPDT switch device 100 according to the disclosure is similar to the first embodiment, but differs from the first embodiment in the structure of the power divider 2.

In the second embodiment, the first and second transmission portions 221, 231 are interwound, and are line-symmetrical with each other. The first and second transmission portions 221, 231 are uniformly spaced apart from each other. The first and second output portions 222, 232 are uniformly spaced apart from each other. The first transmission portion 221 is configured as a circular spiral in a clockwise direction, and the second transmission portion 231 is configured as a circular spiral in a counterclockwise direction, so currents flow in the first and second transmission portions 221, 231 in opposite directions when the power divider 2 is used alone. In this way, the first and second transmission portions 221, 231 establish inverting electromagnetic coupling with each other, and for each of the first and second transmission portions 221, 231, an equivalent inductance thereof is less than a self-inductance thereof. Each of the first and second transmission portions 221, 231 has a 1.35-turn configuration. Because inverting electromagnetic coupling may be established between the first and second transmission portions 221, 231, the length of each of the first and second transmission portions 221, 231 may be reduced from one-twelfth of the target wavelength to one-fourteenth of the target wavelength (i.e., the electrical length is 26°).

Figure 13:
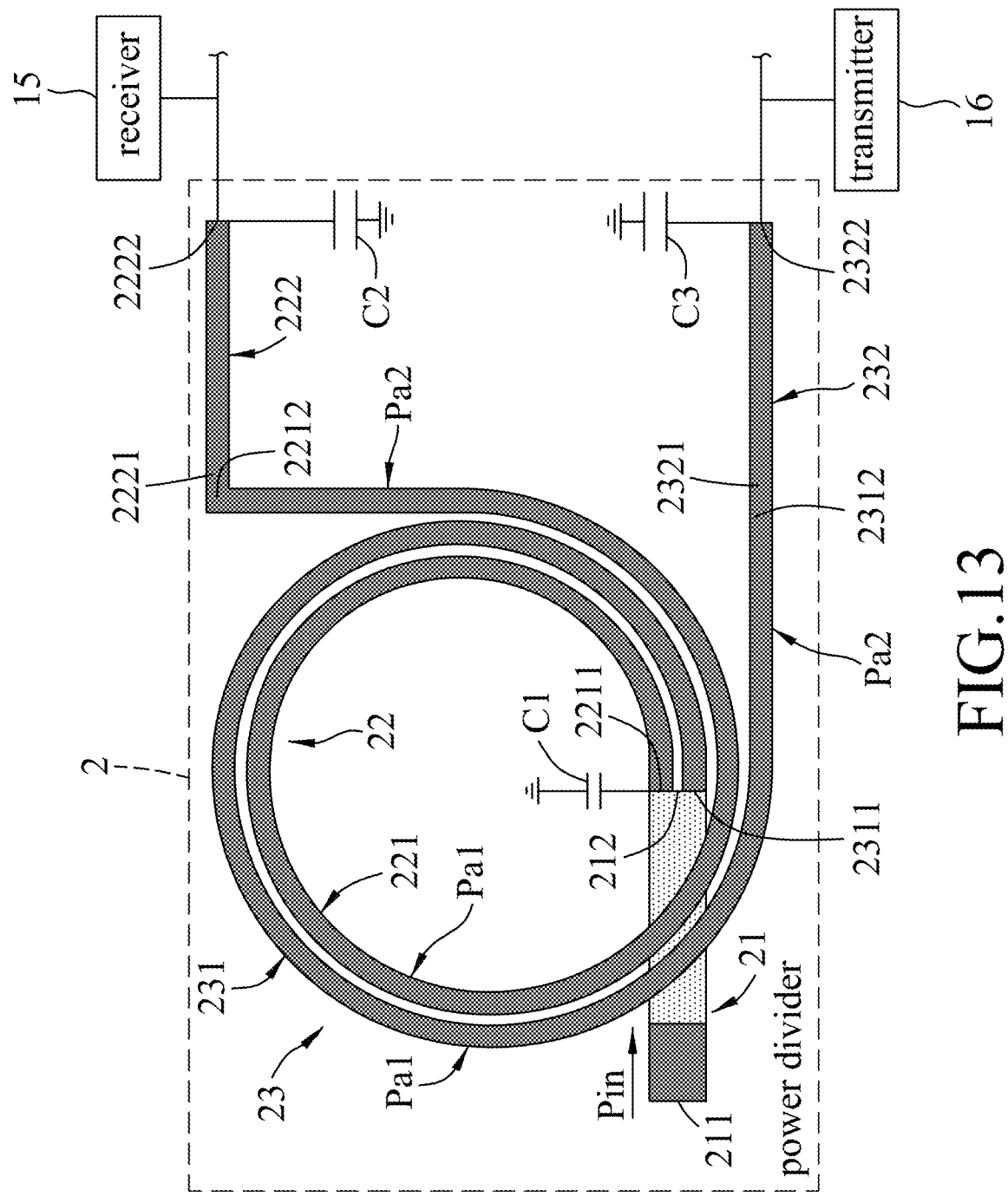
FIG. 13 is a schematic diagram illustrating the power divider of a third embodiment of the SPDT switch device according to the disclosure.

Referring to FIGS. 2 and 13, a third embodiment of the SPDT switch device 100 according to the disclosure is similar to the first embodiment, but differs from the first embodiment in the structure of the power divider 2.

In the third embodiment, the first and second transmission portions 221, 231 are interwound, but are not line-symmetrical with each other. The first part (Pa1) of each of the first and second transmission portions 221, 231 is configured as a circular spiral in a counterclockwise direction. The first parts (Pa1) of the first and second transmission portions 221, 231 are uniformly spaced apart from each other. The second part (Pa2) of each of the first and second transmission portions 221, 231 is configured as a straight strip. Each of the first and second transmission portions 221, 231 has a 1.5-turn configuration. Since the first portion (Pa1) of each of the first and second transmission portions 221, 231 is configured as a circular spiral in a counterclockwise direction, non-inverting electromagnetic coupling may be established between the first and second transmission portions 221, 231, and the length of each of the first and second transmission portions 221, 231 may be reduced from one-twelfth of the target wavelength to one-fourteenth of the target wavelength.

Referring to FIGS. 2, 3, 12 and 14, in view of the above, the aforesaid embodiments offer the following advantages.

1. For the power divider 2 of each of the first to third embodiments, because of the inclusion of the input capacitor (C1) and the output capacitors (C2, C3), the length of each of the first and second transmission portion 221, 231 may be reduced to not greater than one-twelfth of the target wavelength. In addition, for the power divider 2 of each of the second and third embodiments, since the inverting or non-inverting electromagnetic coupling may be established between the first and second transmission portion 221, 231, the length of each of the first and second transmission portion 221, 231 may further be reduced to not greater than one-fourteenth of the target wavelength. Moreover, for the power divider 2 of each of the first to third embodiments, each of the input capacitor (C1) and the output capacitors (C2, C3) occupies a small area. Therefore, for each of the first to third embodiments, the power divider 2 occupies a relatively small area and has a relatively low manufacturing cost as compared to the conventional Wilkinson power divider (see FIG. 1).

2. For each of the first to third embodiments, the power divider 2 exhibits low power loss and good linearity, and conduction resistance of each of the first and second transistors 3, 7 may be reduced and non-conduction resistance of each of the first and second transistors 3, 7 may be increased because of the inclusion of the first and fourth resistors 4, 9, so the SPDT switch device 100 may have good linearity.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that the disclosure is not limited to the disclosed embodiments but is intended to cover various arrangements included within the spirit and scope of the broadest interpretation so as to encompass all such modifications and equivalent arrangements.

What is claimed is:

1. A power divider comprising:
   a first transmission line having a first terminal and a second terminal;
   a second transmission line including a first transmission portion and a first output portion, each of said first transmission portion and said first output portion having a first terminal and a second terminal, said first terminal of said first transmission portion being connected to said second terminal of said first transmission line, said second terminal of said first transmission portion being connected to said first terminal of said first output portion;

a third transmission line including a second transmission portion and a second output portion, each of said second transmission portion and said second output portion having a first terminal and a second terminal, said first terminal of said second transmission portion being connected to said second terminal of said first transmission line, said second terminal of said second transmission portion being connected to said first terminal of said second output portion;

an input capacitor connected between said second terminal of said first transmission line and ground; and two output capacitors, one of which is connected between said second terminal of said first output portion and ground, and the other one of which is connected between said second terminal of said second output portion and ground;

wherein said first and second transmission portions are interwound.

2. The power divider of claim 1, being configured to operate within a frequency range that covers a target frequency, wherein:

said first transmission portion is configured as a circular spiral in a clockwise direction;

said second transmission portion is configured as a circular spiral in a counterclockwise direction; and each of said first and second transmission portions has a length that is one-fourteenth of a target wavelength which corresponds to the target frequency.

3. The power divider of claim 2, wherein said first and second transmission portions establish inverting electromagnetic coupling with each other.

4. A single pole double throw (SPDT) switch device comprising:

a power divider including a first transmission line having a first terminal and a second terminal, a second transmission line including a first transmission portion and a first output portion, each of said first transmission portion and said first output portion having a first terminal and a second terminal, said first terminal of said first transmission portion being connected to said second terminal of said first transmission line, said second terminal of said first transmission portion being connected to said first terminal of said first output portion, a third transmission line including a second transmission portion and a second output portion, each of said second transmission portion and said second output portion having a first terminal and a second terminal, said first terminal of said second transmission portion being connected to said second terminal of said first transmission line, said second terminal of said second transmission portion being connected to said first terminal of said second output portion, an input capacitor connected between said second terminal of said first transmission line and ground, and two output capacitors, one of which is connected between said second terminal of said first output portion and ground, and the other one of which is connected between said second terminal of said second output portion and ground;

an inverter having an input terminal that receives a control signal, and an output terminal that provides an inverted signal, the inverted signal being a logical complement of the control signal in logical value;

a first transistor having a first terminal that is connected to said second terminal of said first output portion of said second transmission line, a second terminal that is connected to ground, a control terminal and a body terminal;

a first resistor connected between said body terminal of said first transistor and said input terminal of said inverter;

a second resistor connected between said control terminal of said first transistor and said input terminal of said inverter;

a second transistor having a first terminal that is connected to said second terminal of said second output portion of said third transmission line, a second terminal that is connected to ground, a control terminal and a body terminal;

a third resistor connected between said control terminal of said second transistor and said output terminal of said inverter; and a fourth resistor connected between said body terminal of said second transistor and said output terminal of said inverter.

5. The SPDT switch device of claim 4, wherein said first and second transmission portions are interwound together.

6. The SPDT switch device of claim 5, being configured to operate within a frequency range that covers a target frequency, wherein:

said first transmission portion is configured as a circular spiral in a clockwise direction;

said second transmission portion is configured as a circular spiral in a counterclockwise direction; and each of said first and second transmission portions has a length that is one-fourteenth of a target wavelength which corresponds to the target frequency.

* * * * *